United States Patent [19]

Edmond et al.

[11] Patent Number: 5,087,576

[45] Date of Patent: Feb. 11, 1992

[54] IMPLANTATION AND ELECTRICAL ACTIVATION OF DOPANTS INTO MONOCRYSTALLINE SILICON CARBIDE

[75] Inventors: John A. Edmond, Apex; Robert F. Davis, Raleigh, both of N.C.

[73] Assignee: North Carolina State University, Raleigh, N.C.

[21] Appl. No.: 356,333

[22] Filed: May 24, 1989

Related U.S. Application Data

[63] Continuation of Ser. No. 113,561, Oct. 26, 1987, abandoned.

[51] Int. Cl.$^5$ ............................................. H01L 21/265
[52] U.S. Cl. ........................................ 437/22; 437/25; 437/100
[58] Field of Search .................... 437/22, 25, 100; 148/DIG. 148

[56] References Cited

U.S. PATENT DOCUMENTS

4,945,394  7/1990  Palmour et al. ................. 437/100 X

OTHER PUBLICATIONS

Edmond et al., "High Temperature Implantation of Single Crystal Beta Silicon Carbide Thin Films", Super Lattices and Thin Films Symp., Boston, Dec. 1-6, 1986.
"Ion Implantation Effects in Silicon Carbide", Excerpt from Oak Ridge National Laboratory (ORNL) Report 6128, Mar. 1986.

*Primary Examiner*—Olik Chaudhuri
*Assistant Examiner*—Ourmazd S. Ojan
*Attorney, Agent, or Firm*—Bell, Seltzer, Park & Gibson

[57] ABSTRACT

The invention is a method of ion implantation of dopant ions into a substrate of silicon carbide. In the method, the implantation takes place at elevated temperatures, following which the substrate may be oxidized or annealed.

24 Claims, 1 Drawing Sheet ing devices from the doped materi-
IMPLANTATION AND ELECTRICAL ACTIVATION OF DOPANTS INTO MONOCRYSTALLINE SILICON CARBIDE This application is a continuation of application of John A. Edmond and Robert F. Davis; Ser. No. 07/113,561; filed Oct. 26, 1987, now abandoned.

FIELD OF THE INVENTION

The present invention relates to methods of forming electrically activated semiconductive silicon carbide and to the production of electrical device from the electrically active silicon carbide.

BACKGROUND

Semiconductors are materials generally defined as having electrical conductivities somewhat between the high conductivity characteristics of metals, and the low conductivity characteristics of insulators. Since the invention of the transistor, the development of electrical devices based on semiconductors has revolutionized the electronics industry.

At the present time, silicon remains the most common semiconductor material for doping and device manufacture, although in recent years much interest has been generated in other semiconductor materials including gallium arsenide (GaAs) and indium phosphide (InP). Many techniques exist for producing pure crystals of these basic elements and compounds and for fabricating them into devices and circuits.

Another material toward which much interest has been directed, but for which limited success in producing practical crystals and devices has been achieved, is silicon carbide (SiC). As a semiconductor material, silicon carbide offers a number of advantageous characteristics which have long been recognized, one of which is its high thermal stability. As an example, although silicon vaporizes at temperatures of approximately 1400° C., silicon carbide remains stable at temperatures approaching 2800° C. Fundamentally, this means that silicon carbide can exist as a solid at extremely high temperatures at which silicon—and silicon based electronic devices—would not only be useless, but completely destroyed.

Second, silicon carbide has a relatively wide band gap, i.e. the energy difference between its valence and conduction bands, of approximately 2.2 electron volts (eV) (beta) or 2.86 C (6H - alpha). This is a rather large gap in comparison to that of silicon (1.1 eV) and means that electrons will have less tendency to move from the valence band to the conduction band solely on the basis of thermal excitation. In practical terms, this allows for silicon carbide-based devices to operate at higher temperatures than equivalent silicon-based devices.

Additionally, silicon carbide has a high thermal conductivity, a low dielectric constant, a high breakdown electric field, and a high saturated electron drift velocity, meaning that at high electric field levels devices made from it can perform at higher speeds than devices made from any of the other conventional semiconductor materials.

Because of all these inherent characteristics, silicon carbide has been a principal and perennial candidate material for application at high temperature, high power, and high speed requirements.

In order to produce a useful electronic device from a semiconductor such as silicon carbide, however, the semiconductor must have some capability for allowing the flow of conducting species from place to place. The two most common species for carrying charge are electrons and holes. Electrons are one of the fundamental subatomic particles carrying negative charge, while "holes" represent an energy level position within an atom where an electron could be placed, but form some reason is temporarily or permanently absent. Because holes are left behind when electrons move, holes can also be thought of as moving from place to place and as carrying positive charge.

In silicon carbide, both the silicon atoms and the carbon atoms have identical valence (or "outer shell") electron populations: i.e., four valence electrons. Other than crystal lattice defects and ordinary thermal population of different energy levels by the electrons, there is no encouragement for electrons or corresponding holes to move from atom to atom, and thereby carry a flow of current. If, however, an appropriate number of slightly different atoms can be added to the crystal, for example aluminum (Al), phosphorous (P), or nitrogen (N), a more conductive material will result. The greater conductivity results because atoms such as nitrogen have five valence electrons, while those such as aluminum have only three. Thus, the presence of some nitrogen atoms in a silicon carbide crystal provides a number of extra electrons which would not be present in a purer silicon carbide crystal. These extra electrons can be encouraged to move from the nitrogen atoms to empty electron positions in the silicon or carbon atoms, resulting in a flow of current. In a similar but opposite manner, the presence of atoms such as aluminum which have only three valence electrons provides available electron positions into which other electrons can move from the silicon or carbon atoms, and thereby carry current.

In terms familiar to the semiconductor industry, such added atoms are referred to as "dopants," and the process of introducing them into semiconductor materials is known as "doping." By doping a semiconductor material such as silicon carbide with either atoms with more valence electrons (n-type doping) or fewer valence electrons, (p-type doping); a semiconductor material can result which has certain specific electrical characteristics, and through which current can be made to flow under particular controlled conditions. Such materials can be fabricated into devices of many types, common examples of which are diodes, capacitors, junction transistors, and field effect transistors, all of which in turn can be built up into circuits and more complicated devices.

Accordingly, in order to produce useful semiconductor electronic devices, at least three basic requirements must be met: first, an appropriate semiconductor material must by available, often in the form of a single crystal or a monocrystalline thin film; second, the ability must exist to dope the semiconductor material in the desired manner; and third, proper techniques must be developed for forming devices from the doped materials.

Accordingly, much interest, research, publication activity, and indeed patent literature, has been directed at producing silicon carbide, doping its, and manufacturing devices from it. In spite of this high level of attention, commercial devices formed from silicon carbide have to date failed to move beyond the literature or the research lab into the commercial marketplace.

Two main categories of failure exist: a lack of any reproducible and precise methods for forming the necessary single crystals of silicon carbide essential for device manufacture; and the lack of successful doping techniques which to date have failed to result in doped monocrystalline silicon carbide having high enough purities, low enough defect levels, and sufficient electrical activation of the dopant species to form any commercially useful devices.

Recently, however, techniques have been developed for successfully growing monocrystalline silicon carbide of high purity and low defect level in each of the two most common forms of silicon carbide, the cubic or beta structure and the hexagonal 6H alpha structure. These developments are the subject of co-pending patent applications assigned to the assignee of the present invention, specifically "Growth of Beta-SiC Thin Films and Semiconductor Devices Fabricated Thereon," Ser. No. 07/113,921, filed Oct. 26, 1987, now U.S. Pat. No. 4,912,063, and "Homoepitaxial Growth of Alpha-SiC Thin Films and Semiconductor Devices Fabricated Thereon," Ser. No. 07/113,573, filed Oct. 26, 1987, now U.S. Pat. No. 4,912,064.

From the doping standpoint, a number of methods exist for introducing an appropriate dopant into a semiconductor substrate. These include diffusion, chemical vapor deposition, and ion implantation. In ion implantation, ions of the dopant atoms are formed by any appropriate method, for example by application of a strong enough field to strip one or more electrons from each dopant atom. The ions are then accelerated, typically through a mass spectrometer to further separate and accelerate the desired dopant atoms, and finally directed into a target material (usually a single crystal or monocrystalline thin film) at energies typically between about 50 and about 300 kilo electron volts (KeV). On an atomic level, this results in severe collisions between the accelerated ions and the atoms of the target crystal. This initially can result in two problems. First, the dopant ions may not be in positions at which electrons and holes can be transferred, i.e. they are not yet "electrically activated." Secondly, a great deal of damage to the target crystal results, and in particular, atoms in the crystal lattice are dislodged from their proper positions to a greater or lesser extend. As is known to those familiar with semiconductor crystallography, such damaged crystals often do not have the electrical properties required for useful semiconductor devices. Accordingly, various attempts and techniques have been developed for dealing with the damage done during implantation.

A first technique is to heat or anneal the doped substrate material following implantation. This heating step, when followed by an appropriate rate of cooling, should theoretically encourage the atoms in the crystal lattice, most of which are atoms of the semiconductor, to recrystallize in an orderly fashion, thus repairing the damage to the semiconductor crystal lattice and allowing the dopant atoms to position themselves for electrical activation. Nevertheless, crystal defects such as dislocations, stacking faults, twins, other defects or combinations of the same, tend to remain following such annealing.

Other researchers have attempted to raise the temperature of the target during implantation, an example of which is U.S. Pat. No. 3,293,084 to McCaldin (Dec. 20, 1966), which discusses ion implantation of silicon, germanium or silicon and germanium alloys with sodium, potassium, rubidium, or cesium as the doping atom. In 1966, however, analytical tools such as transmission electron microscopy (TEM) and deep level transient spectroscopy (DLTS) were unavailable and the residual defects formed under these conditions remained undiscovered.

Accordingly, the more recent development of these analytical tools has demonstrated that ion implantation in silicon conducted at high temperatures results in lattice defects. As presently understood, when silicon is ion implanted at high temperatures, sufficient energy is imparted to the lattice by the incoming ions to cause individual point defects to arrange themselves in a lower energy configuration. These configurations include planar (stacking faults) and line (disclosure or loops) defects, with line defects forming somewhat more often. These defects are, of course, detrimental to the operation of any resulting device formed from that material.

Accordingly, in recent years, emphasis has shifted to ion implantation which is conducted when the target is at a rather low temperature, specifically temperatures on the order of the boiling point of liquid nitrogen (77° K., −196° C.). Under such circumstances, the implantation bombardment of ions creates a totally amorphous region in the target crystal, i.e. one in which no specific crystal structure is present. Performing annealing following the low temperature implantation encourages the implanted region—i.e. the layer represented by the depth to which the bombarding ions have penetrated—to recrystallize into a layer which resembles an epitaxial growth portion, giving this technique the name "solid-phase-epitaxy." Under these conditions, the majority of the defects formed by the initial bombardment remain at the boundary between the recrystallized layer and the layer which was too deep in the crystal to be affected by the bombardment.

Such low temperature implantation followed by annealing represents today's best technology for producing doped silicon materials for electrical devices. Indeed, the quality and performance of electrical devices formed from any given semiconductor material is one of the best indications of the quality of the original material and of the doping technique used to give it its desired properties.

Accordingly, in attempting to find a suitable ion implantation technique for adding dopants to silicon carbide, researchers have attempted to reproduce those techniques found successful with silicon alone. For example, Tohi et al., U.S. Pat. Nos. 3,629,011 and 3,829,333, discuss techniques for implanting ions in silicon carbide at room or "ordinary" temperatures or at relatively low temperatures following which the bombarded silicon carbide is annealed at high temperatures (up to 1600° C.). To date, however, this has proved unsuccessful in producing any device quality doped silicon carbide crystals. In an attempt similar to those described by Tohi, Edmond et al. found that implanting dopants into silicon carbide at liquid nitrogen temperatures indeed produced amorphous layers, but annealing resulted in polycrystalline forms of silicon carbide or defective single crystals or silicon carbide, neither of which were suitable for manufacturing electrical devices, J. A. Edmond, S. P. Withrow, H. S. Kong and R. F. Davis, *Beam Solid Interactions and Phase Transformations,* edited by H. Kurz, G. L. Olson and J. M. Poate (Materials Research Society, Pittsburgh, 1986), p. 395.

Other attempts have likewise been made to implant silicon carbide at ordinary or "room" temperatures. At room temperatures (approximately 293° K. to 298° K.), no technique which produces consistent results has been developed. Some crystals tend to remain crystalline, while others become amorphous in a manner similar to that which occurs that upon low temperature implantation. The layers which remain crystalline during bombardment tend to recover properly upon annealing, but certain problems in the technique remain. At certain dosages of the dopants (dosage control being a requirement for imparting desired electrical properties to the target material), the crystal structure became amorphous. Furthermore, successful annealing has to be conducted at temperatures of approximately 1800° C. These temperatures are well above the vaporization point of the silicon substrates upon which silicon carbide was always deposited prior to the concurrent inventions discussed earlier which produce silicon carbide upon silicon carbide.

Accordingly, there are no known successful techniques in the art for producing device quality, single crystal, electrically activated doped silicon carbide semiconductive materials using conventional ion implantation techniques.

It is therefore an object of the present invention to provide a method of producing either n or p-doped regions in silicon carbide suitable for semiconductor electrical devices.

It is another object of the invention to produce appropriately doped monocrystalline silicon carbide in a manner which prevents amorphization of the silicon carbide crystal during the doping technique while appropriately electrically activating the dopant introduced.

It is a further object of the invention to provide a method for producing doped monocrystalline silicon carbide by ion beam implantation.

It is another object of the invention to provide a method for producing a doped silicon carbide by ion beam implantation conducted at temperatures high enough to prevent amorphization of the silicon carbide followed by removal of the highly conductive near surface layer typically formed from ion implantation, and by electrical activation of the dopant atoms introduced by the ion beam.

It is a further object of the invention to produce electrical devices of useful commercial quality using doped portions of silicon carbide formed according to the ion implantation techniques of the present invention.

SUMMARY OF THE INVENTION

The present invention comprises a method of producing a doped region of silicon carbide suitable for semiconductor electrical devices operable at high temperatures. The method comprises directing an ion beam of dopant ions onto a substrate of silicon carbide in which the silicon carbide is maintained at a temperature high enough to prevent amorphization of, and minimize damage to, the silicon carbide crystal lattice during the ion bombardment. The highly conductive near surface layer which results from the bombardment is removed from the silicon carbide and the silicon carbide is annealed to electrically activate the dopant introduced by the ion beam.

DESCRIPTION OF THE DRAWINGS

The foregoing and other objects, advantages and features of the invention, and the manner in which the same are accomplished will become more readily apparent upon consideration of the following detailed description of the invention taken in conjunction with the accompanying drawings, which illustrate preferred and exemplary embodiments, and wherein.

DETAILED DESCRIPTION

Figure 1:
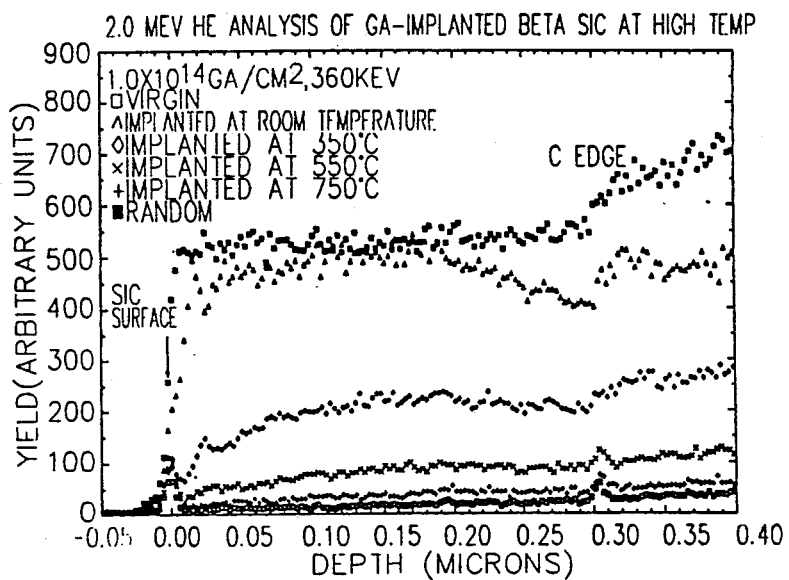
FIG. 1 is the Rutherford Backscattering spectrum for gallium implanted into silicon carbide according to the present invention.

In an initial embodiment of the present invention, ions of aluminum, gallium and nitrogen were implanted into beta silicon carbide thin films while those films were maintained at temperatures of 623° K., and 1023° K. (350° C., 550° C. and 750° C., respectively). These thin films can be produced as described in the aforementioned co-pending applications Ser. Nos. 07/113,921 and 07/113,573, "Growth of Beta-SiC Thin Films and Semiconductor Devices Fabricated Thereon," and "Homoepitaxial Growth of Alpha-SiC Thin Films and Semiconductor Devices Fabricated Thereon," respectively. The resulting doped crystals were analyzed using Rutherford Backscattering (RBS)/ion channeling techniques. These demonstrated that implantation of any of the above species at 623° K. resulted in only slight crystal lattice damage. In comparison, ion implantation conducted at the same dopant dosage and energy levels at room temperature resulted in either extensive lattice damage or, in the case of gallium, amorphization. When samples implanted at 1023° K. were analyzed, lattice damage was almost non-existent.

These beneficial effects of higher temperature implantation do not, however, by themselves necessarily result in the complete electrical activation of the implanted dopant. Therefore, in order to optimize electrical activation, samples according to the present invention were annealed at about 1473° K. (1200° C.) for up to 30 minutes following implantation. Differential capacitance-voltage, spreading resistance, and sheet resistance technique demonstrated that activation of both p-type and n-type species (aluminum and nitrogen) had all been successfully accomplished. The maximum percentage of activated and room temperature ionized dopants were 0.5 percent and 60 percent for aluminum and nitrogen, respectively. This corresponds to activation levels of approximately 40 percent and 95 percent, respectively, based upon normal carrier concentration calculations using the respective ionization energies at room temperature.

In one embodiment of the invention, each sample of beta silicon carbide was mechanically polished, chemically oxidized, and then etched in hydrofluoric acid (HF) to produce a clean, undamaged and smooth surface prior to bombardment. Initial electrical measurements using differential capacitance-voltage measurements were also made before implanting for base line comparative reference purposes. The ion implantation was again conducted primarily at the three temperatures of 623° K., 823° K., and 1023° K. Some generally insignificant deviation from these temperatures occurred as the result of temperature variations in the sample holder.

In practice, the ion beam was generated using a hot filament source and was directed towards the beta silicon carbide thin film using an offset angle of 7° from the sample surface normal in order to reduce channeling effects. Table I summarizes the implantation conditions utilized for this work, in which N equals the electron density, p equals the hole density, both expressed in exponential notation (e.g., 3E16 represents $3 \times 10^{16}$ carriers per cubic centimeter) as carriers per cubic centimeter ([n or p]/cm$^3$) and the implant dosage is expressed as atoms per square centimeter (atoms/cm$^2$), also in exponential notation.

TABLE I

| | Conditions and results of high temperature implantation of Al and N in Beta-SiC | | | | |
|---|---|---|---|---|---|
| Sample No. | Starting n or p | Implant Species | Implant Energy (keV) | Implant Dose | Implant Temp. (K) | Final n or p |
| 1. | n = 3E16 | Al$^+$ | 130 | 3.9E14 | 1023 | p = 1E16 |
| 2. | n = 2E16 | Al$^+$ | 185 | 1.8E14 | 1023 | p = 4E16 |
| 3. | n = 3E16 | Al$^+$ | 160 | 2.3E14 | 1023 | p = 1E16 |
| 4. | n = 4E16 | Al$^+$ | 100 | 4.8E14 | 1023 | p = 4E16 |
| 5. | n = 2E16 | Al$^+$ | 185 | 6.3E14 | 623 | p = 5E15 |
| 6. | n = 2E16 | Al$^+$ | 185 | 6.3E14 | 823 | p = 1E16 |
| 7. | n = 2E16 | Al$^+$ | 185 | 6.3E14 | 1023 | p = 1E16 |
| 8. | n = 2E16 | Al$^+$ | 185 | 1.3E15 | 1023 | p = 6E16 |
| 9. | n = 2E16 | Al$^+$,Al$^{++}$ | 150,300 | 4.3,6.8E14 | 1053 | p = 5E15 |
| 10. | n = 2E16 | Al$^+$ | 300 | 6.8E14 | 1023 | p = 5E15 |
| 11. | p = 9E17 | N$^+$ | 90,180 | 1.1,1.7E14 | 973 | n = 2E18 |
| 12. | p = 4E17 | N$^+$,N$^{++}$ | 180,360 | 1.7,2.2E14 | 993 | n = 4E18 |
| 13. | p = 2E17 | N$^+$ | 90,180 | 0.9,1.3E14 | 623 | n = 1E18 |
| 14. | p = 1E17 | N$^+$ | 90,180 | 0.9,1.3E14 | 823 | n = 3E18 |
| 15. | p = 2E16 | N$^+$ | 90,180 | 0.9,1.3E14 | 1023 | n = 3E18 |

As set forth earlier herein, in order to structurally characterize the residual lattice damage caused by the implantation at the higher temperatures, Rutherford Backscattering (RBS)/ion channeling techniques were used. The backscattering analyses were producing using 2.0 MeV helium ions incident along the [110] axial direction. These tests were performed for samples implanted with each species at room temperature (298° K., 25° C.) as well as the three elevated temperatures. Differential capacitance-voltage, spreading resistance and sheet resistance measurements were made in order to electrically characterize the layers. Initial measurements indicated that highly conductive surface layers existed in the samples, leading to an undesirable excess leakage current. Although applicants do not wish to be bound by any particular theory, it appears that the conductive surface layer may represent a silicon-rich surface layer which results as the bombardment forces carbon away from the surface and into the crystal.

Accordingly, the invention further comprises removing this highly conductive near surface layer from the silicon carbide which results from this effect of the directed ion beam. In a preferred embodiment of the invention, the step of removing the highly conductive near surface layer comprises oxidizing the highly conductive near surface layer and then removing the thus oxidized near surface layer. Further to the preferred embodiment, the step of oxidizing the near surface layer comprises heating the silicon carbide in the presence of oxygen at a temperature and for a time period sufficient to substantially oxidize all of the highly conductive near surface layer, with temperature ranges of 1000° to 1500° C. being desirable and a temperature of about 1200° C. most preferred. A typical time period was 30 minutes. This removal step generally removed no more than approximately 500 angstroms of material from the surface.

In another embodiment, the highly conductive near surface layer can be removed using various dry or wet etching techniques. Typical dry etching techniques include reactive ion etching, reactive ion beam etching, and plasma etching. Typical wet etching techniques include molten salt etching techniques using a variety of salt combinations.

Finally, in order to successfully complete the electrical activation of the dopant species, the silicon carbide is further annealed. In preferred embodiments of the invention, the step of annealing the silicon carbide comprises heating the silicon carbide at a temperature of between about 1000° Centigrade and about 1500° Centigrade, with a temperature of approximately 1200° Centigrade most preferred. In the most preferred embodiment of the invention, the oxidizing removal of the highly conductive near surface layer is conducted by heating the sample in the presence of dry oxygen, following which the oxygen is replaced by argon while heating at the same temperature and for the same time period continues. In yet another embodiment, the removal of the highly conductive near surface layer and the annealing to electrically activate the dopant can be combined into a single step in which the bombarded silicon carbide is heated in the presence of oxygen for a time and temperature sufficient to both remove the highly conductive near surface layer and to electrically activate the dopant introduced by the ion beam.

Figure 2:
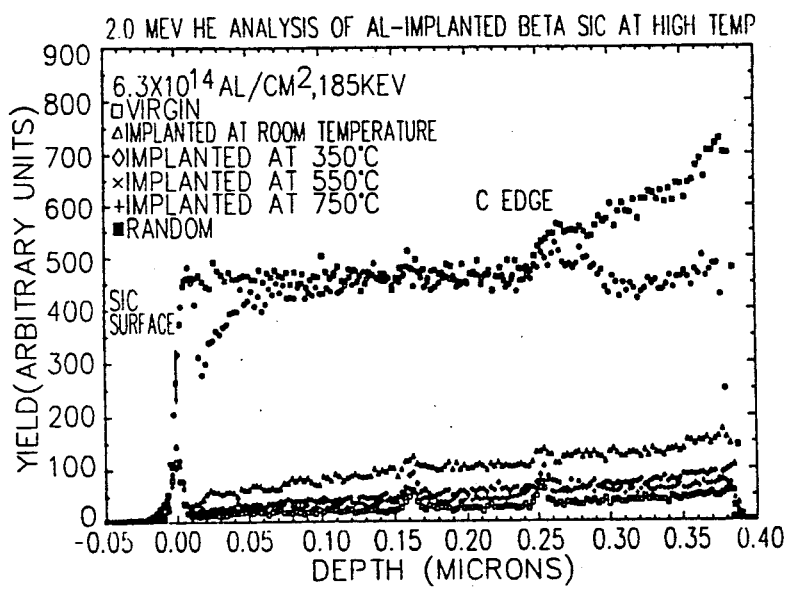
FIG. 2 is the corresponding spectrum for aluminum.
Figure 3:
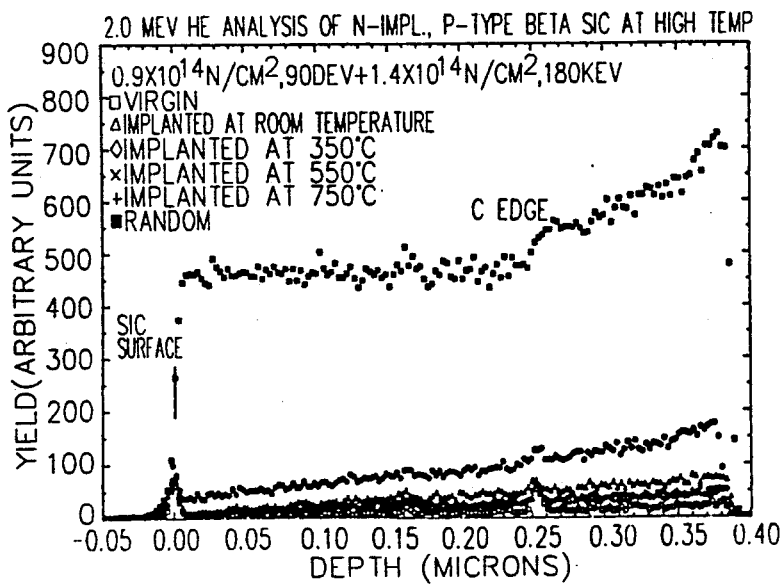
FIG. 3 is the corresponding spectrum for nitrogen.

FIGS. 1, 2 and 3 represent the RBS spectra for gallium, aluminum, and nitrogen implanted silicon carbide respectively. The spectra illustrate the damage accumulation as a function of implant temperature. It will be seen in each case that damage decreased with increasing implant temperature, with the spectra obtained from the 1023° K. implants being nearly coincidental with that of the virgin aligned undoped beta silicon carbide. This extremely low damage level was also demonstrated when the silicon carbide was implanted with aluminum or nitrogen at 823° K.; however, gallium, with a much larger atomic weight, tended to require the 1023° K. implantation temperature in order to minimize induced residual damage. The electrical properties for each implanted sample are also listed in Table I. These demonstrate that increasing the implant temperatures from 623° K. to 823° K. increases dopant activation, but implanting at 1023° K. does not cause a corresponding additional increase in this parameter.

In order to further study the implantation of nitrogen (N) in beta silicon carbide at elevated temperatures, p-type substrates were initially utilized. In every case, an n-type conducting layer resulted from the introduction of nitrogen. The percentage of ionized activated dopant ranged from about 20 percent for the 623° K. implant to about 60 percent for the 823° K. or greater implant. As was the case in the study of aluminum, maximum activation was achieved at the 823° K. implant.

Accordingly, the invention demonstrates three major advantages: residual damage to the crystal lattice is greatly reduced; improved activation of the dopants is achieved at much lower annealing temperatures (1200° C. versus 1800° C.); and the above processes can take place at temperatures at which silicon remains stable such that silicon substrates can be used in all of these processes where desirable or necessary.

The success provided by the present invention in producing doped regions with very few residual defects in single crystal silicon carbide films has been demonstrated by a corresponding success in producing electronic devices of commercial-level performance and quality using silicon carbide implanted according to the present invention.

EXAMPLE 1

MOSFET

A metal oxide semiconductor field effect transistor (MOSFET) was fabricated in 1.2 micron thick n-type layers on approximately 0.5 micron thick p-type beta silicon thin film crystals grown by chemical vapor deposition on 6H alpha silicon carbide crystals. The thin film was grown as described in the concurrently pending applications set forth earlier. The dopant for the p-type portion was aluminum which diffused from a heavily aluminum doped 6H alpha silicon carbide substrates.

The thin films were polished, oxidized to remove the polishing damage, and etched in hydrofluoric acid (HF) to remove the remaining oxide film. The gate oxide was then grown and cleaned. A 500 micron thick film of polysilicon was applied to the oxide via low pressure CVD, doped, and then patterned to form the gate contacts. The N type source and drain areas were then formed by the high temperature ion implantation of nitrogen through the oxide, according to the present invention. Windows for the source and drain were formed and tantalum silicide (TaSi$_2$) was then applied and patterned and annealed.

MOSFETs formed in this manner showed very stable drain current saturation out to a drain source voltage of 25 volts. The drain characteristics of this device were also determined at 673° K. and at every 50° K. interval to a maximum of 923° K. Satisfactory operation of all of these transistors was observed up to 923° K. Stable saturation and channel cut-off were achieved throughout this temperature range at drain-source voltages exceeding 25 volts. Transconductance increased with temperature to 573° K., and decreased with temperature after 673° K.

EXAMPLE 2

P-N Junction Diode

Standard semiconductor diodes were fabricated in single crystal silicon carbide using the high temperature ion implantation of the present invention. Two device configurations were developed, planar and mesa. The diodes had the following characteristics: rectification was observed with leakage currents ranging from 5 microamps (uA) to 50 uA at 300K and 673K, respectively, at a reverse bias of 5 V. Forward bias current-voltage characteristics revealed the presence of space-charge-limited current flow, consistent with the characteristics of wide bandgap semiconductors such as silicon carbide.

In the drawings and specification, particular examples and embodiments have been described. It will be understood, however, that these have been set forth as examples, rather than limitations, the scope of the invention being defined by the claims.

That which is claimed is:

1. A method of producing an n or p-doped region of silicon carbide suitable for semiconductor electrical devices, the method comprising:

directing an ion implantation beam of dopant ions onto a monocrystalline silicon carbide substrate in which the silicon carbide is maintained at a temperature high enough to substantially prevent damage to the silicon carbide crystal lattice and to position implanted dopant ions from the ion beam in the near vicinity of substitutional lattice sites in the monocrystalline silicon carbide substrate;

removing the highly conductive near surface layer from the monocrystalline silicon carbide substrate which layer results from the directed ion beams independently of the effects of maintaining the substrate at the high temperature of implantation or of the temperature of any subsequent heating and the heating the monocrystalline silicon carbide substrate to a temperature higher than the temperature at which the substrate is maintained during implantation while low enough to prevent silicon atoms from evaporating from the substrate in any substantial amounts, and which heating supplies sufficient kinetic energy to the implanted dopant ions to encourage the implanted dopant ions to move to and occupy substitutional lattice sites thereby electrically activating the implanted dopant ions.

2. A method according to claim further comprising annealing the silicon carbide to electrically activate the dopant introduced by the ion beam.

3. A method according to claim 2 wherein the step of annealing the silicon carbide follows the step of removing the highly conductive near surface layer.

4. A method according to claim 1 wherein the step of maintaining the silicon carbide at a temperature high enough to substantially prevent damage to the silicon carbide crystal lattice comprises maintaining the silicon carbide at a temperature of 823K or greater.

5. A method according to claim 1 wherein the step of maintaining the silicon carbide at a temperature high enough to substantially prevent damage to the silicon carbide crystal lattice comprises maintaining the silicon carbide at a temperature of 1023K. or greater.

6. A method according to claim 1 wherein the step of removing the highly conductive near surface layer comprises dry etching.

7. A method according to claim 1 wherein the step of removing the highly conductive near surface layer comprises wet etching.

8. A method according to claim 1 wherein the step of removing the highly conductive near surface layer comprises removing not more than approximately 500 angstroms of material from the silicon carbide substrate.

9. A method according to claim 1 wherein the step of removing the highly conductive near surface layer near surface layer comprises heating the silicon carbide in the presence of oxygen at a temperature and for a time period sufficient to substantially oxidize all of the highly conductive near surface layer.

10. A method according to claim 9 wherein the step of heating the silicon carbide in the presence of oxygen comprises heating the silicon carbide at a temperature of between about 1000° and 1500° centigrade.

11. A method according to claim 9 wherein the step of heating the silicon carbide in the presence of oxygen comprises heating the silicon carbide to a temperature of about 1200° centigrade.

12. A method according to claim 2 wherein the step of annealing the silicon carbide comprises heating the silicon carbide at a temperature and for a time period sufficient to substantially oxidize all of the highly conductive near surface layer.

13. A method according to claim 12 wherein the step of heating the silicon carbide comprises heating the silicon carbide to a temperature of between about 1000° and 1500° centigrade.

14. A method according to claim 12 wherein the step of heating the silicon carbide comprises heating the silicon carbide to a temperature of about 1200° centigrade.

15. A method according to claim 1 wherein the step of directing an ion beam of dopant ions comprises directing an ion beam of aluminum ions.

16. A method according to claim 1 wherein the step of directing an ion beam of dopant ions comprises directing an ion beam of nitrogen ions.

17. A method according to claim 1 wherein the step of directing an ion beam of dopant ions comprises directing an ion beam of gallium ions.

18. A method of producing an n or p-doped region of silicon carbide suitable for semiconductor electrical devices, the method comprising:
   directing an ion beam of dopant ions onto a substrate of silicon carbide in which the silicon carbide is maintained at a temperature high enough to substantially prevent damage to the silicon carbide crystal lattice and to position implanted dopant ions from the ion beam in the near vicinity of substitutional lattice sites in the monocrystalline silicon carbide substrate;
   heating the silicon carbide in the presence of oxygen at a temperature of between about 1000° and about 1500° centigrade for a time period sufficient to substantially oxidize all of the highly conductive near surface layer which results from the directed ion beams; and
   thereafter heating the silicon carbide in the presence of a noble gas at a temperature of between about 1000° and about 1500° centigrade which supplies sufficient kinetic energy to the implanted dopant ions to encourage the implanted dopant ions to move to and occupy substitutional lattice sites thereby electrically activating the implanted dopant ions.

19. A method according to claim 18 wherein the step of heating the silicon carbide in the presence of oxygen comprises heating the silicon carbide at a temperature of about 1200° centigrade.

20. A method according to claim 18 wherein the step of heating the silicon carbide in the presence of a noble gas comprises heating the silicon carbide in the presence of argon at a temperature of about 1200° centigrade.

21. A method of producing an n or p-doped region of silicon carbide suitable for semiconductor electrical devices, the method comprising:
   directing an ion beam of dopant ions onto a substrate of silicon carbide in which the silicon carbide is maintained at a temperature high enough to substantially prevent damage to the silicon carbide crystal lattice and to position implanted dopant ions from the ion beam in the near vicinity of substitutional lattice sites in the monocrystalline silicon carbide substrate;
   removing the highly conductive near surface layer which results from the directed ion beam from the silicon carbide by heating the silicon carbide in the presence of oxygen at a temperature of between about 1000° and about 1500° centigrade for a time period sufficient to substantially oxidize all of the highly conductive near surface layer; and
   introducing a noble gas to substantially displace all of the oxygen in the system while continuing to heat the silicon carbide at a temperature of between about 1000° and 1500° centigrade which supplies sufficient kinetic energy to the implanted dopant ions to encourage the implanted dopant ions to move to and occupy substitutional lattice sites thereby electrically activating the implanted dopant ions following the displacement of oxygen by the introduced noble gas.

22. A method according to claim 21 wherein the step of heating the silicon carbide in the presence of oxygen comprises heating the silicon carbide at a temperature of about 1473K.

23. A method according to claim 21 wherein the step of introducing a noble gas while continuing to heat the silicon carbide comprises heating the silicon carbide at a temperature of about 1200° C.

24. A method according to claim 21 wherein the step of directing an ion beam of dopant ions comprises directing an ion beam consisting of ions selected from the group aluminum, nitrogen or gallium.

* * * * *

UNITED STATES PATENT AND TRADEMARK OFFICE
CERTIFICATE OF CORRECTION

PATENT NO. : 5,087,576

DATED : February 11, 1992

INVENTOR(S) : Edmond et al.

It is certified that error appears in the above-identified patent and that said Letters Patent is hereby corrected as shown below:

At column 1, line 13, "device" should be --devices--.

At column 2, line 7, "form" should be --for--.

At column 2, line 64, "its" should be --it--.

At column 3, line 45, "extend" should be --extent--.

At column 5, line 12, "has" should be --had--.

At column 6, line 15, after "623° K.", insert --823° K.--.

At column 6, line 41, "technique" should be --techniques--.

IN THE CLAIMS:

At column 10, line 28, "the" should be --then--.

At column 10, line 39, after "claim" insert --1--.

At column 10, line 54, "K." should be --K--.

UNITED STATES PATENT AND TRADEMARK OFFICE
CERTIFICATE OF CORRECTION

PATENT NO. : 5,087,576

DATED : February 11, 1992

INVENTOR(S) : Edmond et al.

It is certified that error appears in the above-identified patent and that said Letters Patent is hereby corrected as shown below:

At Column 11, line 49, "beams" should be --beam--.

Signed and Sealed this

Tenth Day of August, 1993

Attest:

MICHAEL K. KIRK

*Attesting Officer*     *Acting Commissioner of Patents and Trademarks*

UNITED STATES PATENT AND TRADEMARK OFFICE
CERTIFICATE OF CORRECTION

PATENT NO. : 5,087,576
DATED : February 11, 1992
INVENTOR(S) : John A. Edmond and Robert F. Davis It is certified that error appears in the above-identified patent and that said Letters Patent is hereby corrected as shown below:

Column 1,
Line 4, the following statement should appear as the first paragraph:
-- The U.S. Government has a paid-up license in this invention and the right in limited circumstances to require the patent owner to license others on reasonable terms as provided for by the terms of contract N00014-82-K-0182 awarded by the Office of Naval Research. --

Signed and Sealed this

Fifteenth Day of March, 2005

JON W. DUDAS
*Director of the United States Patent and Trademark Office*